United States Patent [19]

Momodomi et al.

[11] Patent Number: 5,591,999
[45] Date of Patent: Jan. 7, 1997

[54] ELECTRICALLY ERASABLE PROGRAMMABLE READ ONLY MEMORY DEVICE WITH AN IMPROVED MEMORY CELL PATTERN LAYOUT

[75] Inventors: Masaki Momodomi; Junichi Miyamoto; Toshiharu Watanabe, all of Yokohama, Japan

[73] Assignee: Kabushiki Kaisha Toshiba, Kawasaki, Japan

[21] Appl. No.: 257,188

[22] Filed: Jun. 8, 1994

[30] Foreign Application Priority Data

Jun. 8, 1993 [JP] Japan .................... 5-137739

[51] Int. Cl.$^6$ .................................... H01L 29/788
[52] U.S. Cl. .................... 257/315; 257/316; 257/384; 257/757; 365/185.17
[58] Field of Search .................... 257/316, 315, 257/321, 322, 318, 324, 326, 382, 383, 384, 757; 365/185.17, 185.12

[56] References Cited

U.S. PATENT DOCUMENTS

| | | | |
|---|---|---|---|
| 4,910,578 | 3/1990 | Okamoto | 257/757 |
| 4,959,812 | 9/1990 | Momodomi et al. | |
| 4,962,414 | 10/1990 | Liou et al. | 257/757 |
| 5,028,553 | 7/1991 | Esquivel et al. | |
| 5,179,427 | 1/1993 | Nakayama et al. | 257/316 |
| 5,235,200 | 8/1993 | Komori et al. | 257/315 |
| 5,282,160 | 1/1994 | Yamagata | 257/316 |
| 5,289,423 | 2/1994 | Natale et al. | 365/185.12 |
| 5,321,286 | 6/1994 | Koyama et al. | 257/315 |
| 5,448,091 | 9/1995 | Bryant et al. | 257/315 |
| 5,488,245 | 1/1996 | Shimizu et al. | 257/322 |

FOREIGN PATENT DOCUMENTS

| | | | |
|---|---|---|---|
| 3844115 | 7/1989 | Germany. | |
| 62-20374 | 1/1987 | Japan | 257/384 |
| 1-186655 | 7/1989 | Japan. | |
| 4-14255 | 1/1992 | Japan | 257/382 |

OTHER PUBLICATIONS

Japanese Journal of Applied Physics, vol. 30, No. 4, pp. 627–632, Apr. 1991, Jin–Yeong Kang, et al., "Fabrication and Operational Stability of Inverted Floating Gate E$^2$PROM (Electrically Erasable Programmable Read Only Memory)".

*Primary Examiner*—Mahshid Saadat
*Assistant Examiner*—Courtney A. Bowers
*Attorney, Agent, or Firm*—Oblon, Spivak, McClelland, Maier & Neustadt, P.C.

[57] ABSTRACT

A semiconductor memory device according to the present invention comprises a plurality of electrically rewritable memory cells, each of which contains a drain and a source, at least one source line coupled to the sources of the memory cells through a contact hole, and bit lines arranged so as to avoid the contact hole.

18 Claims, 10 Drawing Sheets

ELECTRICALLY ERASABLE PROGRAMMABLE READ ONLY MEMORY DEVICE WITH AN IMPROVED MEMORY CELL PATTERN LAYOUT

BACKGROUND OF THE INVENTION

1. Field of the Invention

This invention relates to a semiconductor memory device, and more particularly to an electrically rewritable nonvolatile semiconductor memory device (EEPROM) with an improved memory cell pattern layout.

2. Description of the Related Art

One known EEPROM in the field of semiconductor memory devices is a NAND-cell EEPROM enabling large-scale integration. A NAND cell has the following configuration.

A plurality of memory cells are arranged in the column direction, for example. Of these memory cells, the sources and drains of adjacent memory cells are shared and connected in series one after another. Connecting in this way forms unit cell groups (NAND cells) where a plurality of memory cells are connected in series. Each unit cell group, treated as a unit, is connected to a corresponding bit line via a select gate having an FETMOS structure.

A memory cell has an FETMOS structure where a floating gate, serving as a charge storage layer and a control gate are stacked. These gates and memory cells are integrated into an array in a p-well formed in an n-type substrate. The drain of a NAND cell is connected to a bit line via the select gate, and the source of the NAND cell is connected to another source line (another reference potential line) via a select gate. The control gate of each memory cell is connected to corresponding word line, where each word line is arranged in the row direction.

Figure 1:
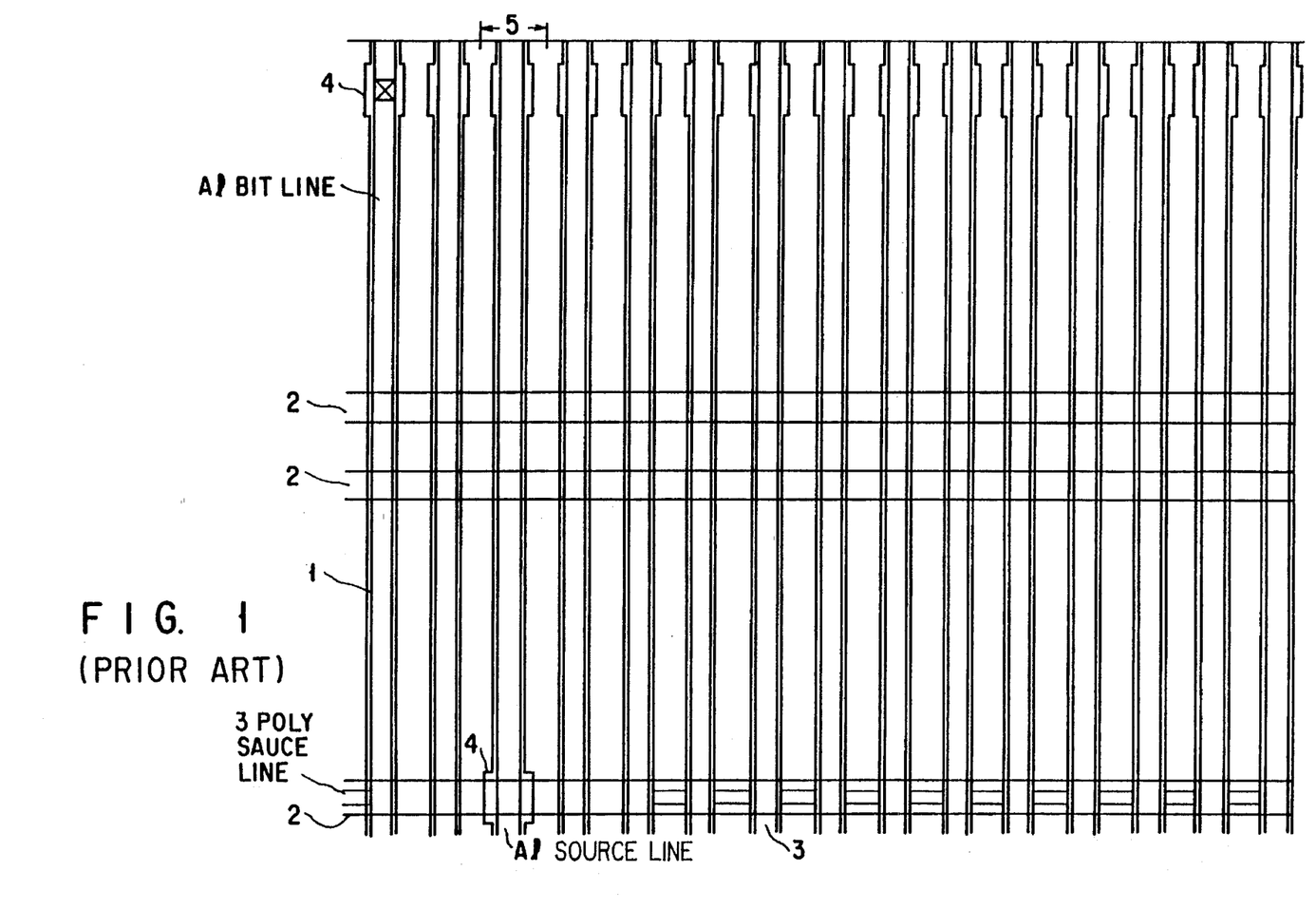
FIG. 1 is a plan view of a layout of conventional NAND cells.

FIG. 1 is a layout diagram of conventional memory cells. The figure only shows diffusion layers 1 acting as sources and drains, tungsten polycides 2, which is a film composed of polysilicon and metal, serving as source lines, Al wire layers 3 serving as bit lines, and contacts 4 between the Al layers 3 and the tungsten polycides 2 or the diffusion layers 1.

The source diffusion layer of every other NAND cell is brought into contact with a tungsten polycide, thereby lowering the source resistance. However, when memory cells are made finer and the lateral or vertical cell size becomes smaller, Al bit lines cannot be patterned under the minimum design rules in terms of lithography and processing.

The reason will be described below.

In the prior art, the minimum line width and interval of tungsten polycides are 0.55 μm or 0.6 μm, the minimum size of the contact between a tungsten polycide and a diffusion layer is 0.6 μm×0.7 μm, the minimum Al wire width and its interval are 0.8 μm, and the minimum size of the contact between Al and a diffusion layer is 0.8 μm×0.9 μm. Therefore, the size of an Al wire portion is greater than that of a tungsten polycide.

The contact portion of Al and a diffusion layer is a serious hindrance to miniaturize memory cells, since its aspect ratio is larger than that of the contact between a polycide and a diffusion layer. Furthermore, since an Al layer has a thickness of 800 nm, thicker than that of a polycide, the coupling capacity between bit lines is greater, causing a faulty operation. Because a polycide wire to a source has larger resistance than an Al wire, it takes longer time to discharge a cell current during a reading operation. In addition, since a shunt portion 5 to be in contact with an Al wire is needed for a specific number of cells, this makes the chip area larger.

As described above, since the conventional EEPROM including NAND cell uses Al wires as bit lines, it is necessary to make the wire width, the distance between wires, and the contact size relatively larger, thus hindering the memory cells from being made finer. Furthermore, the Al wires must be made thicker so as to be in contact with the underlying layer, causing faulty operation due to coupling noise between the bit lines.

SUMMARY OF THE INVENTION

The object of the present invention is to provide an EEPROM assuring stable operation by reducing coupling noise between the bit lines through miniaturization of the memory cells.

The foregoing object is accomplished by providing a semiconductor memory device comprising: a plurality of electrically rewritable memory cells, each of which contains a drain and a source; at least one source line coupled to the sources of the memory cells through a contact hole; and bit lines arranged so as to avoid the contact hole.

The memory cells may be connected in series to form NAND cells.

The foregoing object is also accomplished by providing a semiconductor memory device comprising: a plurality of electrically rewritable memory cells allocated in arrays, each of which contains a drain and a source; source lines, which is served as a second conductive layer, connected to the sources of the memory cells and containing metal wires; and bit lines, which is served as a first conductive layer, connected to the drains of the memory cells and containing one of a polycide wire layer and a silicide wire layer.

With this configuration, the bit lines are formed of a first conductivity layer and the source lines are formed of a second conductive layer. The first conductive layer contains either a polycide wire layer or a silicide wire layer. The second conductive layer contains a metal wire layer.

The foregoing object is still accomplished by providing a semiconductor memory device comprising: a plurality of memory cell units, each of the memory cell units having memory cell transistors connected in series, the memory cell transistors having a charge storage layer, a control gate, a drain and a source; bit lines connected to the drains at one end of the memory cell unit and formed of a first conductive layer selected from one of silicide and polycide wires placed perpendicularly to the direction in which the memory cell units are arranged; source lines connected to the sources at another end of the memory cell unit and formed of a second conductive layer containing metal wires placed in parallel to the direction in which the memory cell units are arranged; and an isolation pattern which is selectively formed on the sources and couples to one of the source lines, wherein the bit lines are placed so as to avoid the isolated pattern.

The bit lines may be patterned by bending bit lines one after another, starting with the closest bit line to the isolated pattern, and making the amount of bend in the bit lines less one after another as the distance from the isolated pattern increases.

The bit lines may be formed of a tungsten polycide layer with a thickness of 200 to 400 nm. The source lines may be formed by bringing the source diffusion layers into direct contact with the tungsten polycide layer and then the tungsten polycide layer into contact with an Al layer.

With the present invention, a first conductive layer forming the bit lines connected to drain diffusion layers is placed so as to avoid the connecting portion of a source diffusion layer and a second conductive layer, thereby allowing contact with the source portion within the cell pitch. This is effective in miniaturizing a memory cell array. By using as the first conductive layer polycide wires whose contact size, wire width, and between-wire distance can be made smaller than those of Al wires, memory cells can be miniaturized more, making the contact aspect ratio smaller. Thus, the contact can be made thinner, thereby making coupling noise between adjacent bit lines lower. Consequently, according to the invention, it is possible to prevent a faulty operation from occurring and perform a stable operation.

With the invention, bit lines are formed of a first conductive layer of, for example, polycide, the source lines connected to source diffusion layers are formed of a second conducting layer of, for example, Al, and the first conductive layer forming the bit lines is placed so as to avoid the connecting portion of a source diffusion layer and the second conductive layer. This arrangement enables memory cells to be miniaturized more and reduces coupling noise between bit lines, thereby providing an EEPROM with a stable operation.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE PREFERRED EMBODIMENTS

Hereinafter, an embodiment of the present invention will be explained, referring to the accompanying drawings.

Figure 2:
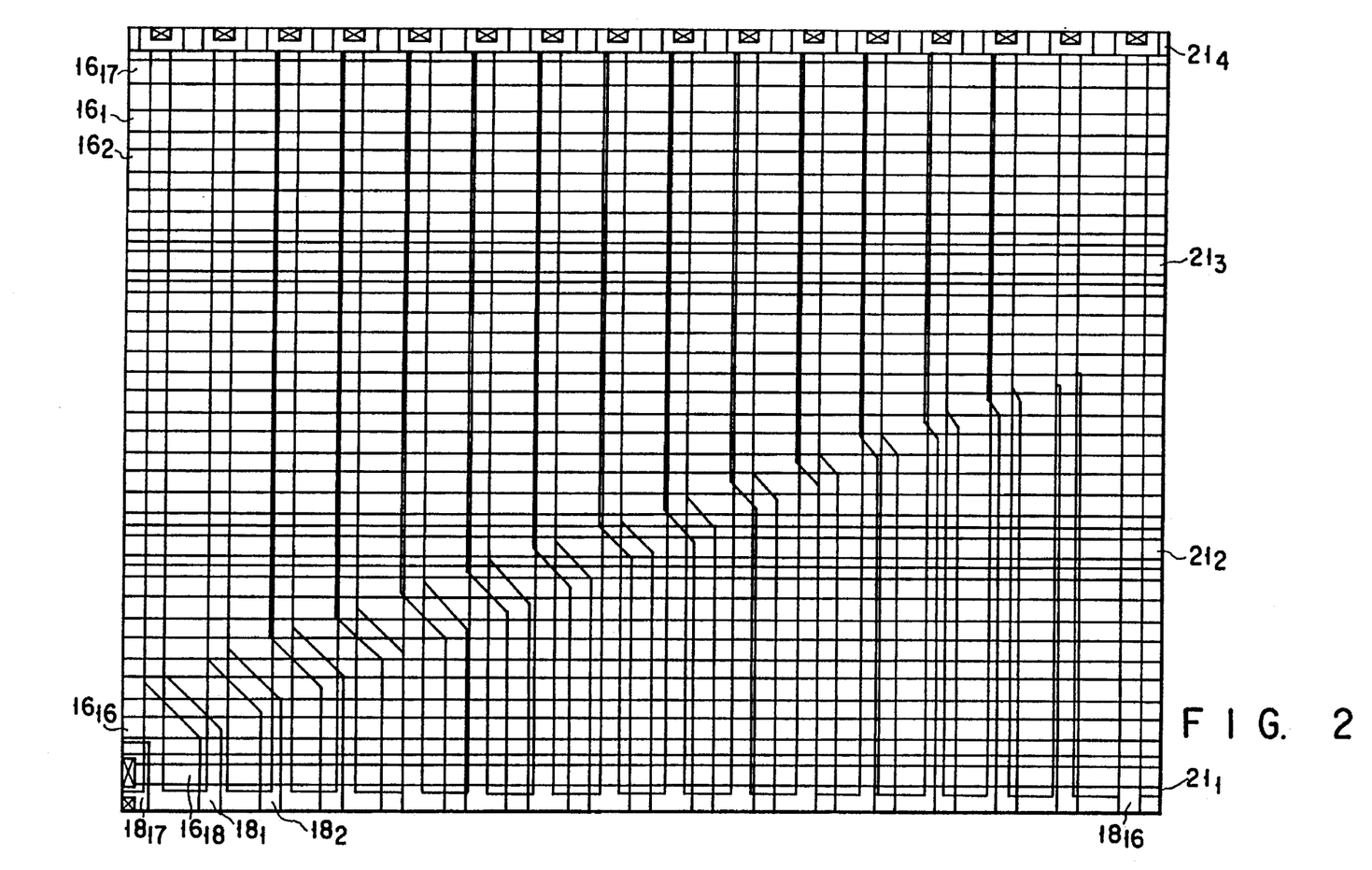
FIG. 2 is a plan view of a NAND cell arrangement of an EEPROM according to an embodiment of the present invention.
Figure 3A:
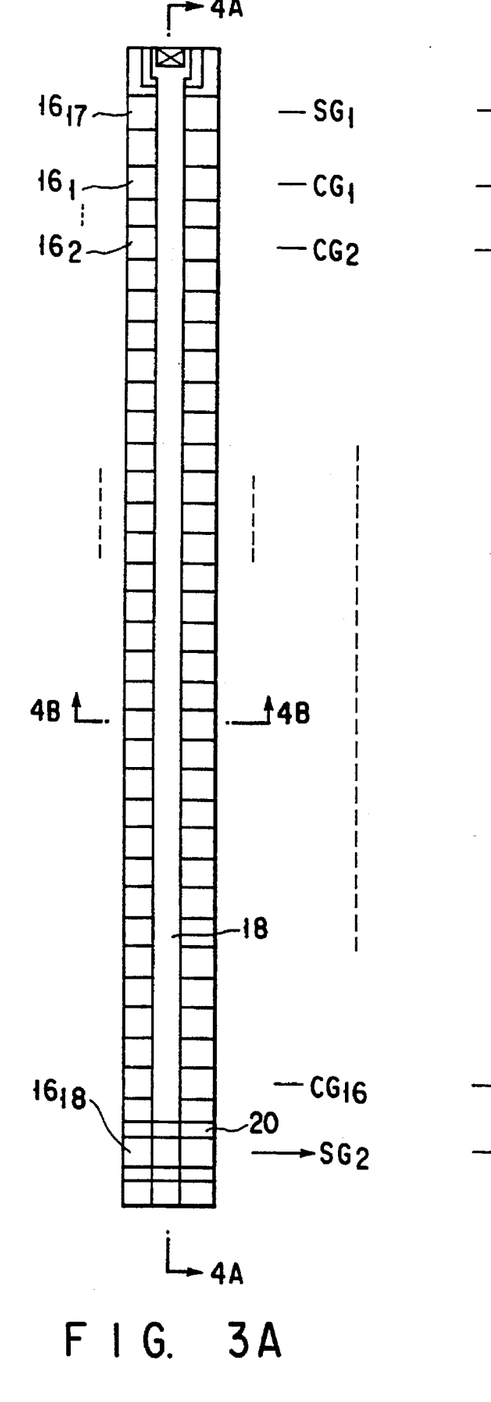
FIGS. 3A and 3B are a plan view and an equivalent circuit diagram of a set of NAND cells.
Figure 3B:
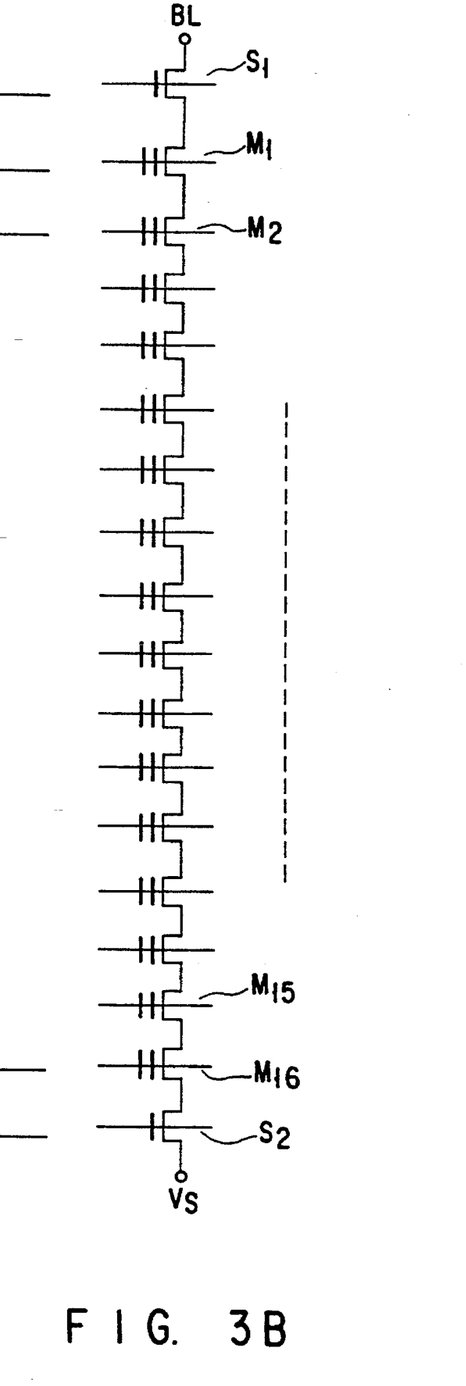
Figure 4A:
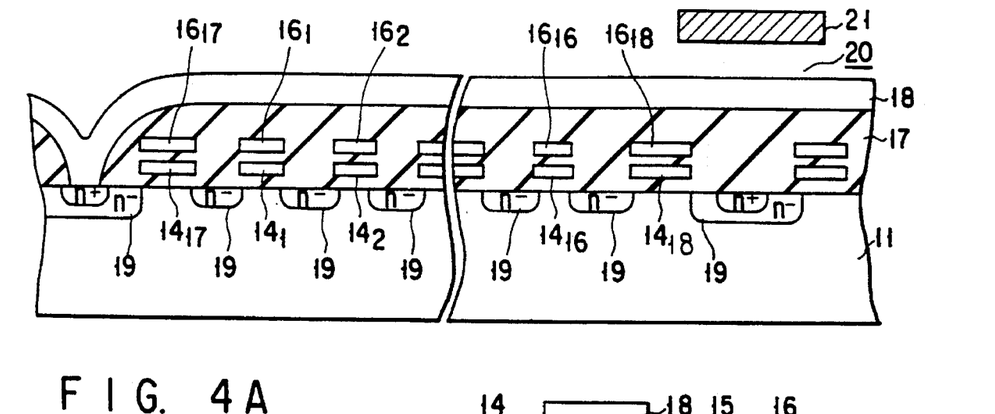
FIGS. 4A and 4B are sectional views taken along line 4A—4A and line 4B—4B in FIG. 3A, respectively.
Figure 4B:
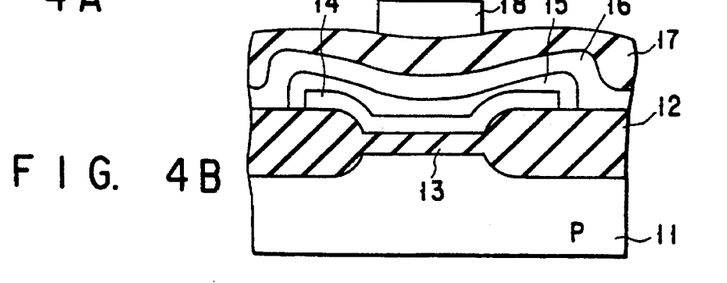

FIGS. 2 to 4 show the arrangement of the NAND cell portion of an EEPROM according to an embodiment of the present invention. FIG. 2 is a pattern diagram of 16 sets of NAND cells arranged in the lateral direction, each set having 16 unit cells and two select gate transistors connected in series. Bit lines (a first conductivity layer) 18 ($18_1$ to $18_{16}$) connected to the drain diffusion layers of NAND cells and extending in the longitudinal direction are made of polycides which are films composed of compound such as polysilicon and tungsten, molybdenum, or the like. A source line (a second conductive layer) 211 connected to the source diffusion layers of NAND cells and extending in the lateral direction is made of metal such as Al.

A portion of the first conductive layer 18 is formed on a source diffusion layer as an isolated pattern $18_{17}$. The isolated pattern $18_{17}$ is connected to the source diffusion layer through a contact hole. A source line made of the second conductive layer $21_1$ is connected to the isolated pattern $18_{17}$ through a contact hole.

The bit lines made of the first conductive layer 18 excluding the isolated pattern $18_{17}$ are arranged so as to avoid the isolated pattern $18_{17}$. Specifically, the bit lines are patterned in such a manner that they are bent, starting with the closest bit line to the isolated pattern $18_{17}$. The amount of bend decreases as the distance from the isolated pattern $18_{17}$ increases.

A plan view and an equivalent circuit diagram of a set of NAND cells are shown in FIGS. 3A and 3B, respectively. In this embodiment, 16 memory cells $M_1$ to $M_{16}$ are connected in series to form a NAND cell. On the drain side of the NAND cell, a select transistor $SG_1$ is provided, and on the source side, a select transistor $SG_2$ is provided.

FIGS. 4A and 4B are sectional views taken along line 4A—4A and line 4B—4B in FIG. 3. In a p-type region (substrate) 11 enclosed by an element isolating oxide film 12, a plurality of memory cells are connected in series to form each NAND cell. The memory cell array contains a plurality of NAND cells. Hereinafter, for the sake of clarity, only one NAND cell will be explained.

On the p-type region 11, floating gates 14 ($14_1$ to $14_{16}$) composed of polysilicons are formed via a gate insulating film 13. Above these floating gates 14, control gates 16 ($16_1$ to $16_{16}$) composed of polysilicon are formed via an interlayer insulating film 15. Each n-type diffusion layer 19 is shared as a source by one of two adjacent memory cells and as a drain by the other. This allows each memory cell to be connected in series.

The drain side and the source side of a NAND cell are provided with select gates $14_{18}$ and $16_{18}$ formed by the same process as the floating gate and control gate of a memory cell. The portion above the substrate 11 on which the elements are formed in this way is covered with a CVD oxide film 17. On the CVD oxide film 17, a bit line 18 is placed. The bit line 18 is brought into contact with a drain diffusion layer 19 at one end of the NAND cell. The top of the bit line 18 is covered with a CVD oxide film 20. On this oxide film, a source wire 21 is formed.

The control gates 16 in the same row of NAND cells arranged in the row direction are connected in common and provided as control gate lines $CG_1$ to $CG_{16}$ running in the row direction. These control gate lines serve as word lines. The select gates $14_{17}$ and $16_{18}$ are provided as select gate lines $SG_1$ and $SG_2$ running in the row direction.

The floating gates 14 are formed of a first-layer polysilicon layer, the control gates 16 are formed of a second-layer polysilicon layer, and the bit line 18 is formed of a tungsten polycide layer.

The operation of NAND cell will be explained as follows.

Data bits are sequentially starting with the farthest memory cells from the drain side of the NAND cell. In case of n-channel memory cell, a high-potential $V_{pp}$ (e.g., 20 V) is applied to the control gate of the selected memory cell, and an intermediate potential $v_M$ (e.g., 10 V) is applied to the control gates of the non-selected memory cells which are nearer than the selected memory cell to the drain side of the NAND cell A 0 V (e.g., "1") or the intermediate potential (e.g., "0") is applied to the bit line according to the data bit to be written. At this time, the potential of the bit line is transferred to the drain of the selected memory cell via the selected gate and the non-selected memory cells.

If the data bit "1" is to be written a high-potential is applied between the control gate and the drain of the selected memory cell, and electrons are injected to the floating gate from the substrate by the tunnel effect. Therefore, the threshold value of the selected memory cell shifts in the positive direction. If the data bit "1" is to be written, the threshold value does not change.

In a data erasing operation, a high-potential is applied to the p-type substrate (an n-type substrate if a p-type well structure is employed), the control gate of the selected memory cell is set to 0 V, and the high-potential is applied to the control gate of non-selected memory cells. For this reason, electrons on the floating gate are discharged to the substrate in the selected memory cell, and the threshold value shifts in the negative direction.

In a data reading operation, the non-selected memory cells nearer to the drain side of the NAND cell than the selected memory cell are turned on, and 0 V is supplied to the gate of the selected memory cell. At this time, by reading a current flowing in the bit line, "0" or "1" is judged.

A feature of the present embodiment is that the bit line 18 does not have a straight line pattern, but has a pattern avoiding the isolated pattern $18_{17}$ of the tungsten polycide at the source section.

Figure 5A:
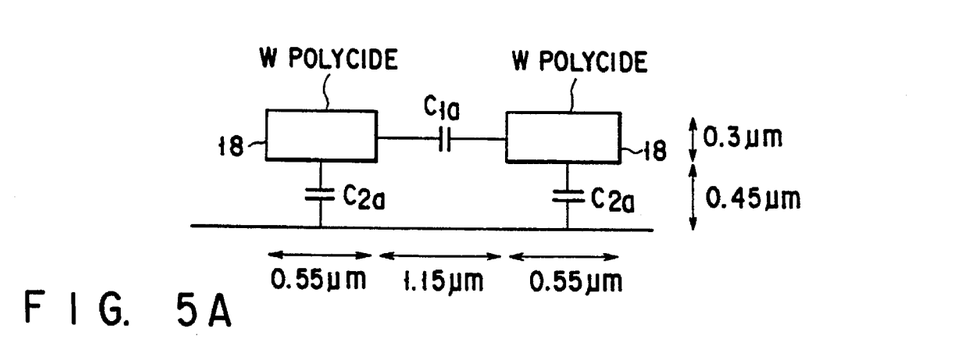
FIGS. 5A and 5B are equivalent circuits for calculating the capacity between bit lines.
Figure 5B:
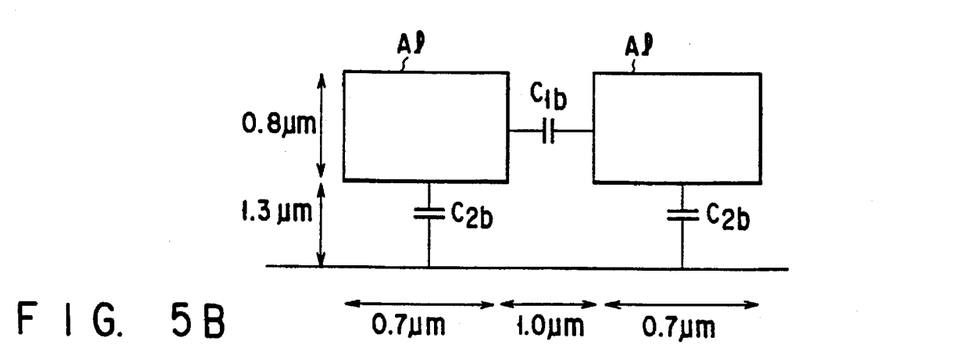

The capacity between adjacent bit lines at this time will be calculated roughly. FIG. 5A shows the case where the bit lines in FIG. 2 are formed of tungsten silicides, and FIG. 5B is a sectional view of bit lines made of Al as in the prior art.

The capacity between adjacent bit lines according to the 0.55 μm rules will be obtained.

In the case of a tungsten polycide, since it is easily worked and lithographed, the bit lines are formed so as to have a width of 0.55 μm at intervals of 1.15 μm for the NAND cell's lateral width of 10.7 μm. In the case of Al, they are formed so as to have a width of 0.7 μm at intervals of 1.0 μm (they cannot be formed with a width of 0.55 μm). Furthermore, the film thickness is 0.3 μm for a tungsten polycide, and nearly 0.8 μm for Al because Al is used for the power lines in the peripheral circuits and the contact aspect ration is large.

At this time, the noise ratio between adjacent bit lines per unit length will be:

$$BL(W-\text{polycide})/BL(Al)$$
$$= (2 \times C_{1a}/C_{2a})/(2 \times C_{1a}/C_{2b})$$
$$= 0.14$$

When a tungsten polycide is used, the capacity between bit lines is 14% of that of Al, that is, much lower than that of Al.

Figure 6:
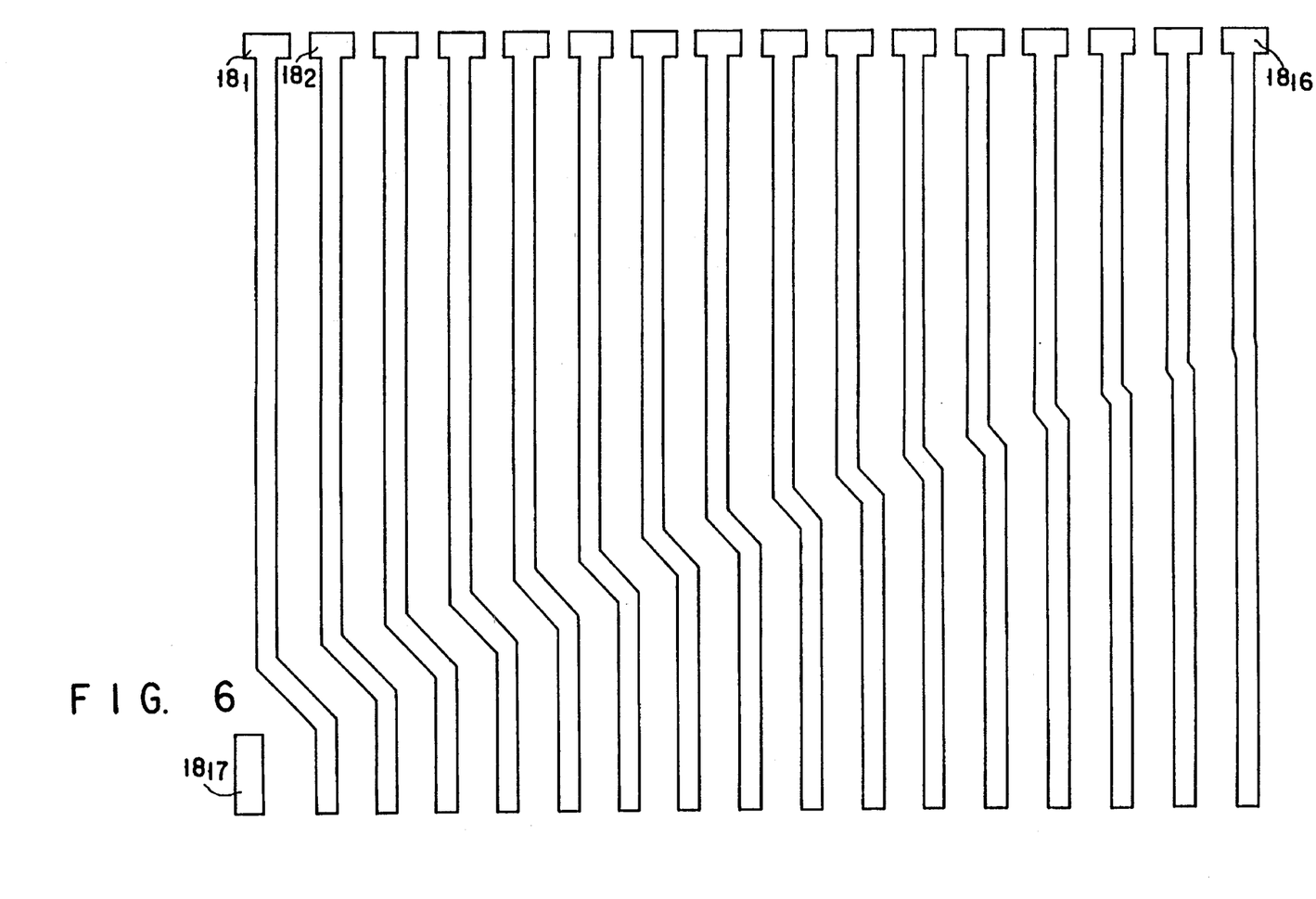
FIG. 6 is a plan view of only the tungsten polycide pattern in FIG. 2.

FIG. 6 is a plan view of only the tungsten polycide pattern in FIG. 2.

The 16 bit lines $18_1$ to $18_{16}$ represent the pattern of bit lines. The isolated pattern $18_{17}$ is a tungsten polycide for getting in contact with the source diffusion layer of a memory cell and further with an Al wire for the source. The bit lines $18_1$ to $18_{16}$ are bent so as to avoid the isolated pattern $18_{17}$. The length of bend in the bit lines $18_1$ to $18_{16}$ is decreased in such a manner that the slant portion of each bit line becomes shorter, starting with the bit line $18_1$. With this configuration, the area of the contact portion between the bit line and the source need not be increased, thereby allowing the patterning without increasing the area of the memory cell array.

Figure 7:
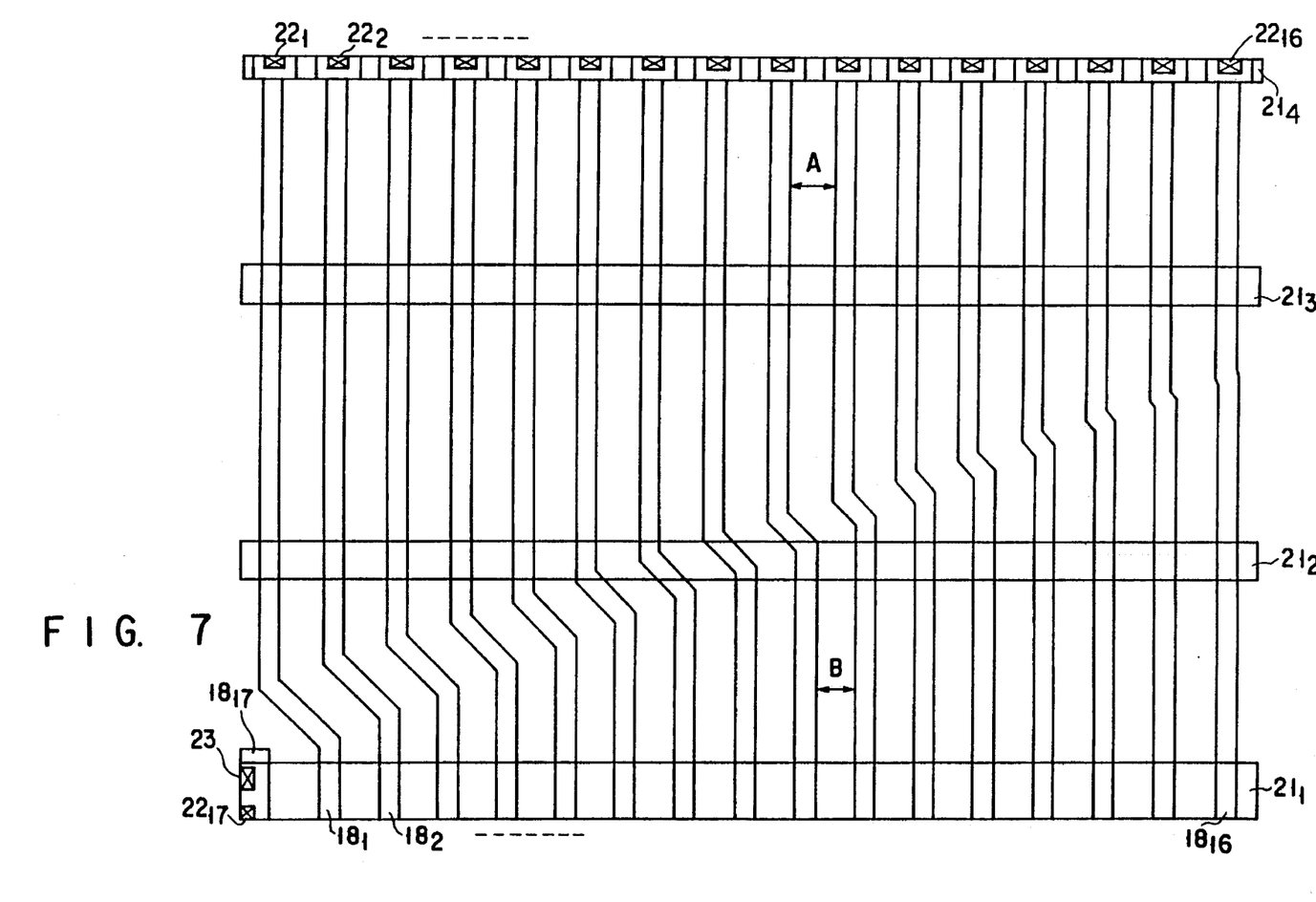
FIG. 7 is a plan view of the pattern of Al layers and that of contact portions in addition to FIG. 6.

FIG. 7 is a view of an Al layer 21, a contact portion 22 between a tungsten polycide and a diffusion layer, and a contact portion 23 between a tungsten polycide and Al, in addition to the pattern of FIG. 6. Half of each of contacts $22_1$ to $22_{16}$ is placed for each NAND cell, one fourth of the contact $22_{17}$ of the source portion is placed for every 16 NAND cells, and half of the contact 23 with Al is placed for every 16 NAND cells.

At the Al layer 21, there are provided the Al wire $21_1$ of the source portion, the signal wires $21_2$ and $21_3$ of the row decoder, and the wire $21_4$ for supplying the potential of a p-well in a memory cell. The Al wire $21_1$ has a greater wire width so that its resistance may be lower than that of wires $21_2$ and $21_3$. Here, the distance between bit lines is 1.15 μm at A portion and a little less 1.05 μm at B portion. This absorbs the expansion due to the isolated pattern $18_{17}$ at the source portion of the tungsten polycide.

Figure 8:
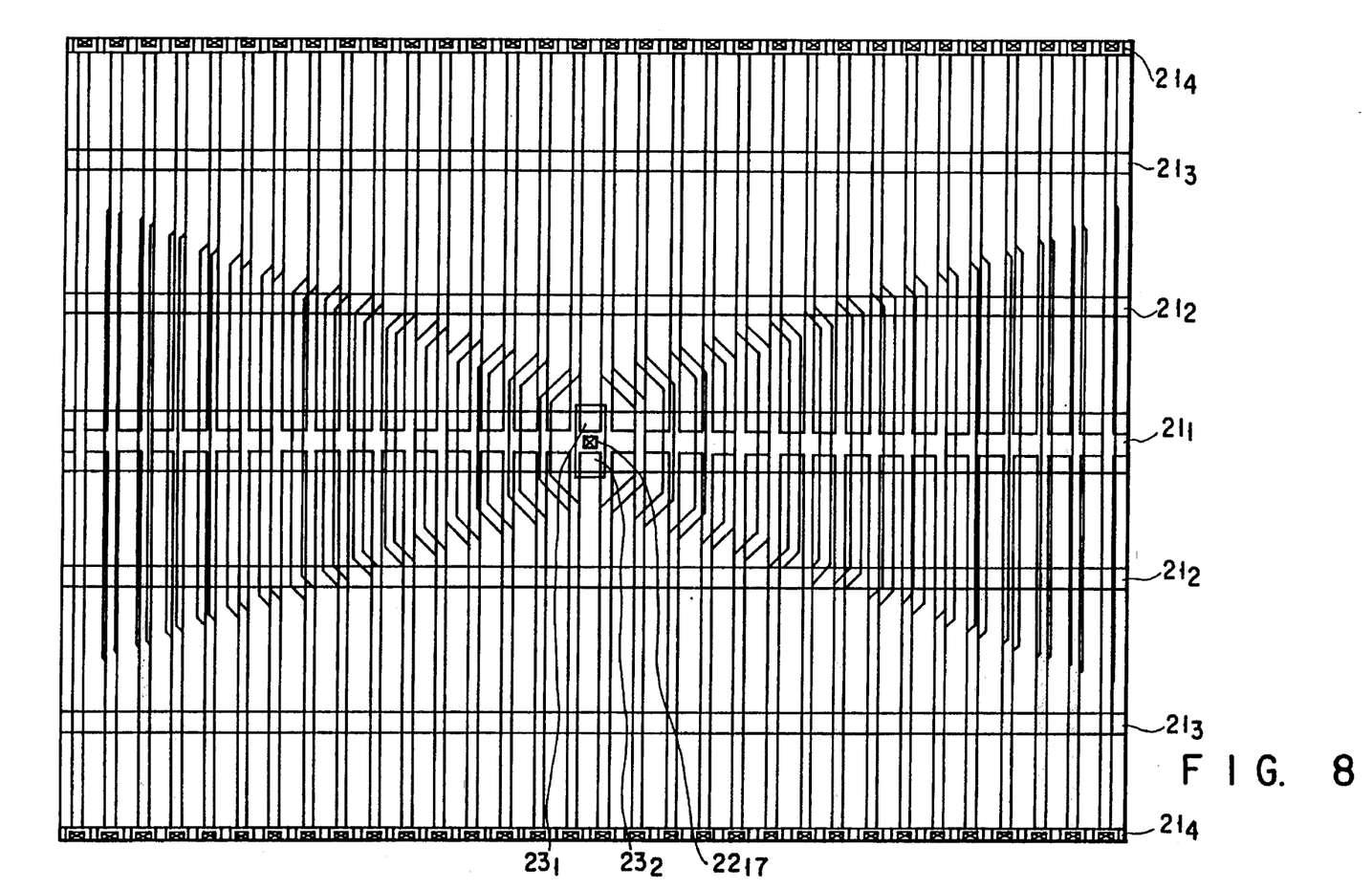
FIG. 8 is a plan view of the arrangement obtained by adding the diffusion layer pattern to the pattern of FIG. 7 and repeating the resulting pattern symmetrically to the right and then to the bottom.

FIG. 8 is a plan view of the arrangement obtained by adding the diffusion layer pattern to the pattern of FIG. 7 and repeating the resulting pattern symmetrically to the right and then to the bottom.

In FIG. 7, as many control gates as one NAND (16 bits)×16=256 bits are placed as shown in FIG. 2. In FIG. 8, as many control gates (not shown) as 256×4=1024 bits are placed. In FIG. 8, there are 32 bit lines and one source line. By repeating this pattern, a desired cell array pattern is formed.

Figure 9:
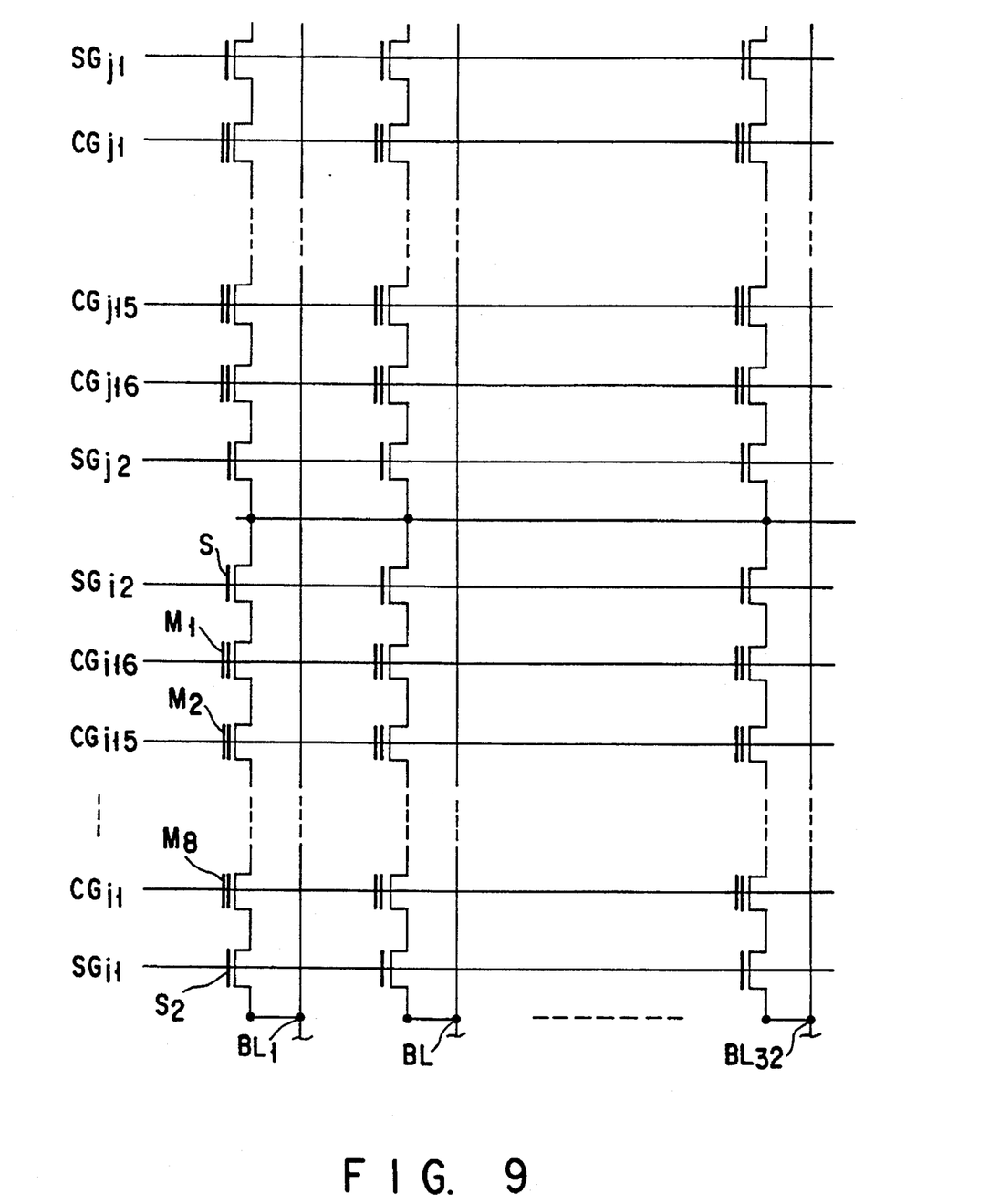
FIG. 9 is an equivalent circuit diagram of the circuit of FIG. 8.

FIG. 9 is an equivalent circuit diagram of FIG. 8.

Figure 10:
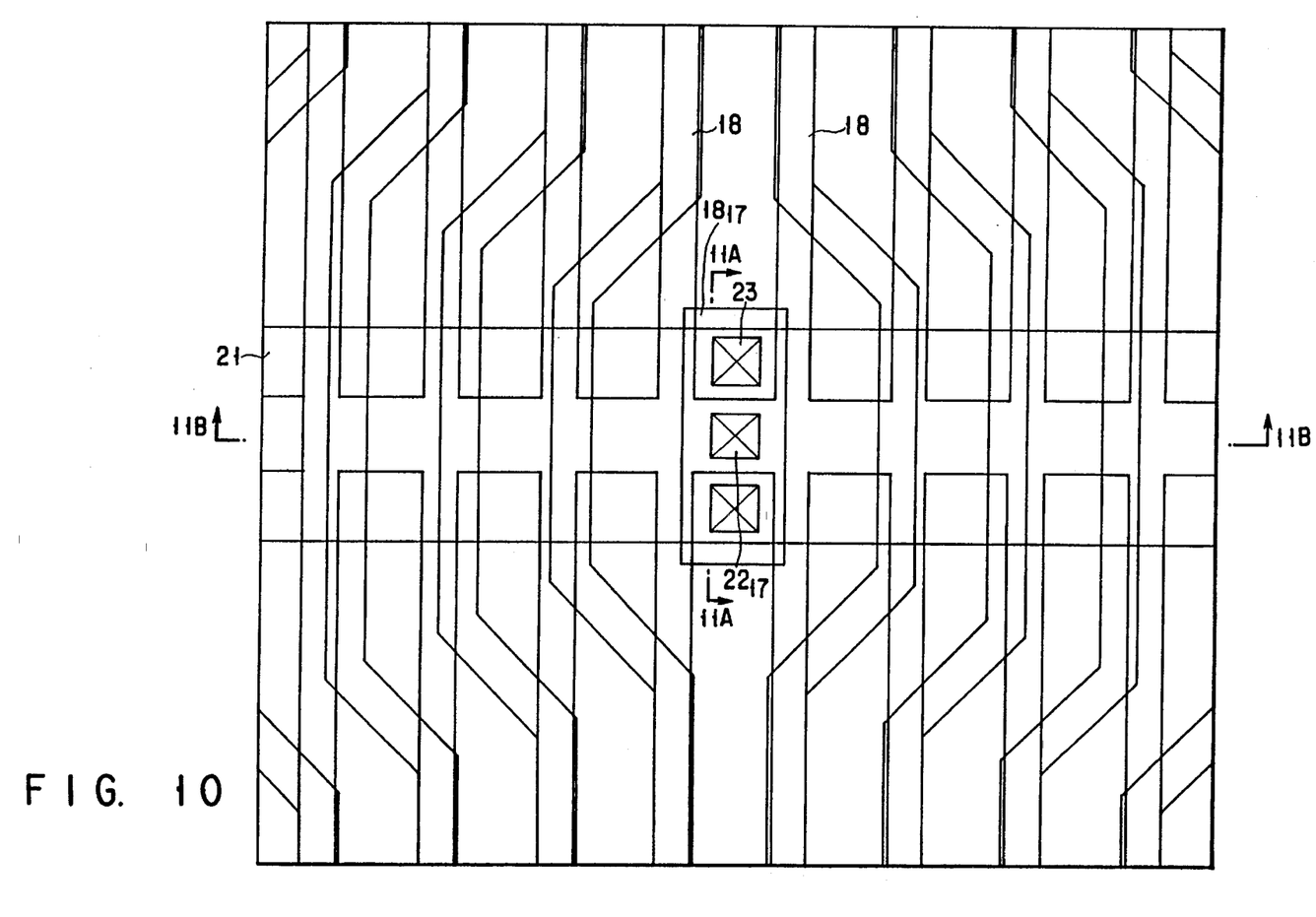
FIG. 10 is an enlarged plan view of the pattern of a source contact portion.
Figure 11A:
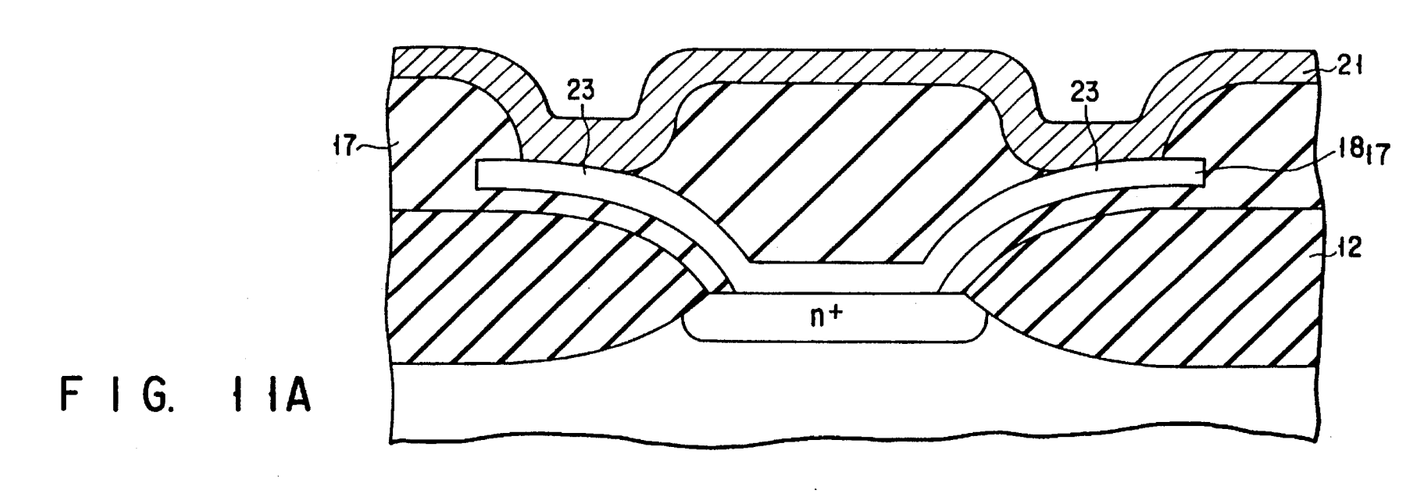
FIGS. 11A and 11B are sectional views taken along line 4A—4A and line 4B—4B in FIG. 10, respectively.
Figure 11B:
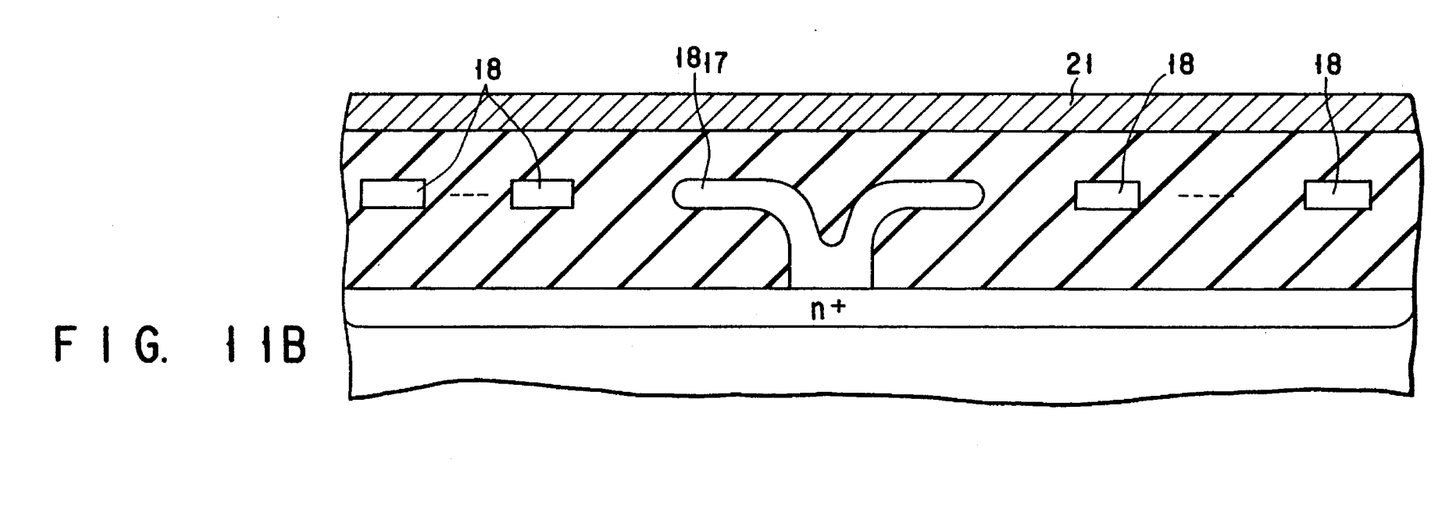

FIG. 10 shows an enlarged pattern of the source contact portion. FIGS. 11A and 11B are sectional views taken along line 11A—11A and line 11B—11B.

Using FIGS. 11A and 11B, the manufacturing processes will be explained.

A field oxide film 12 is formed and then a diffusion layer region is formed. Then, a first-layer polysilicon film, an ONO film, a second-layer polysilicon film (not shown) are formed, followed by the deposition of a CVD oxide film 17. Then, a contact portion of a polycide and a diffusion layer is formed by lithography, and the oxide film at that portion is etched. Thereafter, a polycide film is formed, and this film is brought into contact with the diffusion layer by ion implantation (mixing implantation). Next, after an interlayer insulating film is deposited and the contact portion 23 is etched, an Al layer is formed and patterned.

As described above, with the embodiment, a memory cell array can be miniaturized more by using as bit lines polycide wires 18 whose contact size, wire width, and between-wire distance can be made smaller than those of Al wires. Since in the case of polycide, a polycide film taking a contact into account can be made thinner than Al, coupling noise between adjacent bit lines is reduced, thereby suppressing faulty operation. Bending the polycide wires 18 makes the shunt portions 5 as shown in FIG. 1 unnecessary, allowing the contact of the source portion within the cell pitch. This contributes to the miniaturization of a memory cell array.

This invention is not limited to the above embodiment, but may be practiced or embodied in still other ways without departing from the spirit or essential character thereof.

while in the embodiment, NAND cells are used, the present invention may be applied to NOR cells. Although a tungsten polycide or a molybdenum polycide is most suitable for a first conductive layer and Al is best suited for a second conductive layer, materials are not limited to these, and the materials for the first and second conductive layers can be changed as required according to specification. While in the embodiment, the case where the area of the cell array does not increase due to the source shunt portion 5 of the prior art is described, a source shunt portion may be provided as in the prior art to use polycide wires as bit lines and Al wires as source lines.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   a plurality of electrically rewritable memory cells connected in series to form NAND cells, each of said memory cells including a drain and a source;
   one or more source lines coupled to the sources of said memory cells through a contact hole; and
   bit lines arranged so as to avoid the contact hole, wherein said one or more source lines are arranged above said bit lines;
   wherein said bit lines are formed of a first conductive layer and said one or more source lines are formed of a second conductive layer;
   one or more isolated pattern portions to which said sources are connected and in which said bit lines of the first conductive layer are not formed, wherein said one or more isolated pattern portions are connected to said one or more source lines.

2. A semiconductor memory device according to claim 1, wherein said first conductive layer contains one of a polycide wire layer and a silicide wire layer.

3. A semiconductor memory device according to claim 1, wherein said second conductive layer contains a metal wire layer.

4. A semiconductor memory device according to claim 1, wherein each of said memory cells has a floating gate and a control gate, and has an FETMOS structure which is written or erased by discharging or injecting electrons to or from said floating gate.

5. A semiconductor memory device according to claim 4, wherein the discharging or injection of electrons to or from said floating gate is performed by a tunnel current.

6. A semiconductor memory device according to claim 3, wherein said first conductive layer contains one of a polycide wire layer and a silicide wire layer.

7. A semiconductor memory device comprising:
   a plurality of electrically rewritable memory cells allocated in arrays, each of which contains a drain and a source;
   one or more bit lines, which form a first conductive layer, connected to the drains of said memory cells and composed of one of a polycide wire layer and a silicide wire layer; and
   one or more source lines, which form a second conductive layer, connected to the sources of said memory cells and composed of metal wires, wherein said one or more source lines are arranged above said one or more bit lines; and
   an isolated pattern portion to which said sources are connected and in which said one or more bit lines of the first conductivity layer are not formed, wherein said isolated pattern portion is connected to said one or more source lines;
   wherein each of said memory cells has a floating gate and a control gate, and has an FETMOS structure which is written or erased by discharging or injecting electrons to or from said floating gate;
   wherein said floating gate and said control gate respectively include a third conductive layer and a fourth conductive layer, each layer composed of a semiconductor layer;
   wherein said memory cells are connected in series to form a NAND cell and one end of said NAND cell is coupled to said one or more bit lines and another end thereof is coupled to said one or more source lines.

8. A semiconductor memory device according to claim 7, wherein the discharging or injection of electrons to or from said floating gate is performed by a tunnel current.

9. A semiconductor memory device comprising:
   a plurality of memory cell units, each of said memory cell units having memory cell transistors connected in series, each of said memory cell transistors having a charge storage layer, a control gate, a drain and a source;
   one or more bit lines connected to said drains at one end of one of said memory cell units and formed of a first conductive layer selected from one of silicide and polycide wires placed perpendicularly to the direction in which said memory cell units are arranged;
   one or more source lines connected to said sources at another end of one of said memory cell units and formed of a second conductive layer containing metal wires placed in parallel to the direction in which said memory cell units are arranged, wherein said one or more source lines are arranged above said one or more bit lines; and
   an isolated pattern which is selectively formed on said sources and couples to one of said one or more source lines, wherein said one or more bit lines are placed so as to avoid said isolated pattern.

10. A semiconductor memory device according to claim 9, wherein said one or more bit lines are formed of a tungsten polycide layer with a thickness of 200 to 400 nm.

11. A semiconductor memory device according to claim 10, wherein said one or more source lines are formed by bringing said sources into direct contact with said tungsten polycide layer and then said tungsten polycide layer into contact with an Al layer such that said one or more source lines are not in contact with said one or more bit lines.

12. A semiconductor memory device according to claim 9, wherein said one or more bit lines are patterned by bending said one or more bit lines one after another, starting with the closest bit line to said isolated pattern, and making the amount of bend in said one or more bit lines less one after another as the distance from said isolated pattern increases.

13. A semiconductor memory device according to claim 12, wherein said one or more bit lines are formed of a tungsten polycide layer with a thickness of 200 to 400 nm.

14. A semiconductor memory device according to claim 13, wherein said one or more source lines are formed by bringing said sources into direct contact with said tungsten polycide layer and said tungsten polycide layer into contact with an Al layer such that said one or more source lines are not in contact with said one or more bit lines.

15. A semiconductor memory device as set forth in claim 9, wherein the quantum mechanical tunnelling effect is used to write data to said memory cells.

16. A semiconductor memory device as set forth in claim 1, wherein said bit lines constitute a single layer.

17. A semiconductor device according to claim 1, wherein said bit lines comprise bends shaped to avoid said contact hole, and an amount of bend in each bit line is progressively less as the distance from the contact hole increases.

18. A semiconductor device according to claim 7, wherein said bit lines comprise bends shaped to avoid said isolated pattern and an amount of bend in each bit line is progressively less as the distance from the isolated pattern increases.

* * * * *